US008144505B2

(12) United States Patent
Lee

(10) Patent No.: US 8,144,505 B2
(45) Date of Patent: Mar. 27, 2012

(54) NONVOLATILE MEMORY DEVICES SUPPORTING MEMORY CELLS HAVING DIFFERENT BIT STORAGE LEVELS AND METHODS OF OPERATING THE SAME

(75) Inventor: Chang-Hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 371 days.

(21) Appl. No.: 12/482,132

(22) Filed: Jun. 10, 2009

(65) Prior Publication Data

US 2010/0008140 A1   Jan. 14, 2010

(30) Foreign Application Priority Data

Jul. 11, 2008  (KR) .................. 10-2008-0067707

(51) Int. Cl.
*G11C 11/00* (2006.01)
(52) U.S. Cl. ........................................ 365/163; 365/148
(58) Field of Classification Search .................. 365/163, 365/148
See application file for complete search history.

(56) References Cited

U.S. PATENT DOCUMENTS

| 6,728,133 | B2 | 4/2004 | Shimizu |
| 7,221,589 | B2 | 5/2007 | Li |
| 7,433,246 | B2 | 10/2008 | Lee |
| 2008/0130351 | A1 * | 6/2008 | Nirschl ........................ 365/163 |

FOREIGN PATENT DOCUMENTS

| JP | 2003-022687 | 1/2003 |
| KR | 1020030011229 A | 7/2003 |
| KR | 1020070014470 A | 2/2007 |
| KR | 1020070112224 A | 11/2007 |

OTHER PUBLICATIONS

Lee et al: "Effects of Floating-Gate Interference on NAND Flash Memory Cell Operation" IEEE Electron Device Letters, vol. 23, No. 5, pp. 264-266; May 2002.

* cited by examiner

*Primary Examiner* — Jason Lappas
(74) *Attorney, Agent, or Firm* — Myers Bigel Sibley & Sajovec, P.A.

(57) ABSTRACT

Nonvolatile memory devices include a memory cell array including a first memory cell and an adjacent second memory cell and a data input/output circuit configured to operate the first memory cell as an m-bit cell and to operate the second memory cell as an n-bit cell, wherein m is not equal to n. The first and second memory cells may be adjacent cells connected to same word line or to the same bit line. The memory cell array may include a third memory cell adjacent the first memory cell and the data input/output circuit may be further configured to operate the third memory cell as a k-bit cell. The first and second memory cells may be connected to the same word line and the first and third memory cells may be connected to the same bit line. The data input/output circuit may be configured to operate the first memory cell as a j-bit cell responsive to detecting a number of erase operations for the first memory cell meeting a predetermined criterion, wherein j is less than n. In some embodiments, j may be equal to m.

17 Claims, 9 Drawing Sheets

NONVOLATILE MEMORY DEVICES SUPPORTING MEMORY CELLS HAVING DIFFERENT BIT STORAGE LEVELS AND METHODS OF OPERATING THE SAME

CROSS-REFERENCE TO RELATED APPLICATIONS

This U.S. non-provisional patent application claims priority under 35 U.S.C. §119 to Korean Patent Application No. 10-2008-0067707 filed on Jul. 11, 2008, the disclosure of which is incorporated by reference herein in its entirety.

BACKGROUND

The present invention relates to semiconductor memory devices and, more particularly, to nonvolatile memory devices, computing system incorporating such devices and method of operation of such devices.

An increasing number of electronic apparatuses employ nonvolatile memory devices. For example, nonvolatile memory devices are widely used as storage components in digital cameras, mobile phones, camcorders, flash memory cards, and solid state drives (SSD).

Nonvolatile memories include flash memories. Generally, flash memory devices have nonvolatile characteristics and are capable of electrically programming and erasing data. With recent demands for large capacity and high access speed in applications as large-capacity storage units or code memories, flash memories have become of great interest.

Flash memory devices can be usually classified into NAND and NOR types. A typical NAND flash memory device includes a memory cell array formed of floating-gate transistors. The memory cell array includes pluralities of memory blocks. Each memory block includes strings (hereinafter referred to as 'NAND string') of floating-gate transistors. Each string includes a string selection transistor, a ground selection transistor, and a plurality of memory cells connected between the string and ground selection transistors. Typically, a plurality of word lines is arranged to intersect the strings. Each word line is coupled to control gates of floating-gate cell transistors of the strings it crosses.

A cell array of a typical NOR flash memory device has a structure where a plurality of memory cells is coupled to a bit line. Comparatively, NOR flash memory devices may operate faster than NAND flash memory devices in programming and reading modes. Therefore, the NOR flash memory devices are widely employed in applications requiring high-speed operations. However, NOR flash memory devices commonly provide lower integration density than NAND flash memory devices. To overcome storage capacity limits, multi-level cells (hereinafter referred to as 'MLC') have been adopted for such storage elements. An MLC is able to store multi-bit data, which may overcome physical limits of integration density.

FIG. 1 is a graphic diagram showing threshold voltage distributions of multi-level cells storing 2 bits (MSB and LSB) and data values corresponding thereto. Referring to FIG. 1, the data values of the MLCs '11', '01', '10', and '00' correspond to respective threshold voltages in order. A programming operation begins from '11,' corresponding to an erased state.

The memory cell is programmed to have one of the four states '11', '01', '10', and '00' in correspondence with threshold voltage distribution. First will be described a procedure for programming the least significant bit (LSB). Based on the LSB, the threshold voltage of a memory cell is maintained in the erased state or changed to a level corresponding to the state '10'. For instance, a threshold voltage of the memory cell is maintained in the erased state if the LSB data is '1', or is raised to a threshold value corresponding to the state '10' if the LSB data is '0'.

The most significant bit (MSB) is programmed next. A memory cell in the state '10' is programmed to have the state '00' or the state '10' based on the MSB. In particular, the memory cell in the state '10' is programmed to have the state '00' if the MSB data is '0' or programmed to have the state '10' if the MSB data is '1'. A memory cell in the state '11' is maintained therein or programmed to have the state '01' based on the MSB. In particular, the memory cell in the state '11' is programmed to have the state '01' if the MSB data is '0' or is maintained in the state '11' if the MSB data is '1'. In this manner, multi-bit data may be programmed into a unit memory cell. In sum, the LSB is first programmed, followed by programming of the MSB.

However, as semiconductor memory devices are gradually advanced in integration density, interference between memory cells are becoming an issue. Such interference can cause threshold voltages of memory cells that have been programmed to be changed by application of a program voltage to other memory cells adjacent thereto. Such a change in threshold voltage can result in a corresponding change in data. Such a variation of threshold voltage may be especially troublesome in an MLC because intervals between threshold voltage ranges corresponding to different data values in MLCs typically are narrower in comparison to such intervals in single-level cells (SLCs). For that reason, it is desirable to reduce variation of threshold voltage arising from such interference.

SUMMARY

Some embodiments of the present invention provide nonvolatile memory devices including a memory cell array including a first memory cell and an adjacent second memory cell and a data input/output circuit configured to operate the first memory cell as an m-bit cell and to operate the second memory cell as an n-bit cell, wherein m is not equal to n. The first and second memory cells may be adjacent cells connected to same word line or to the same bit line.

The memory cell array may include a third memory cell adjacent the first memory cell and the data input/output circuit may be further configured to operate the third memory cell as a k-bit cell. The first and second memory cells may be connected to the same word line and the first and third memory cells may be connected to the same bit line. In some embodiments, m may be greater than n and k may be equal to n.

According to additional embodiments, the data input/output circuit may be configured to complete programming of the third memory cell before programming a final bit of the first memory cell in a memory block write operation. In further embodiments, the data input/output circuit may be configured to complete programming of the second and third memory cells before programming a final bit of the first memory cell in a memory block write operation.

In some embodiments, m is equal to 1 and n is equal to 2. The data input/output circuit may be configured to pre-program the second memory cell before programming a first bit for the first memory cell and to re-program the second memory cell after programming the first bit for the first memory cell.

In still further embodiments, the data input/output circuit may be configured to operate the first memory cell as a j-bit cell responsive to detecting a number of erase operations for the first memory cell meeting a predetermined criterion, wherein j is less than n. In some embodiments, j may be equal to m.

Further embodiments of the present invention provide methods of operating nonvolatile memory devices including a memory cell array including a first memory cell and an adjacent second memory cell. The methods include operating the first memory cell as an m-bit cell and operating the second memory cell as an n-bit cell, wherein m is not equal to n. The methods may further include completing programming of the second memory cell before programming a final bit of the first memory cell in a memory block write operation. In some embodiments, m is equal to 1 and n is equal to 2. In some embodiments, the methods may further include pre-programming the second memory cell, programming a first bit for the first memory cell after pre-programming the second memory cell and re-programming the second memory cell after programming the first bit for the first memory cell. The methods may also include operating the first memory cell as a j-bit cell responsive to detecting a number of erase operations for the first memory cell meeting a predetermined criterion, wherein j is less than n.

Additional embodiments provide a computing system including a nonvolatile memory device including a memory cell array including a first memory cell and an adjacent second memory cell and a data input/output circuit configured to operate the first memory cell as an m-bit cell and to operate the second memory cell as an n-bit cell, wherein m is not equal to n. The computing system further includes a host configured to use the nonvolatile memory device as a storage unit.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DETAILED DESCRIPTION

Figure 1:
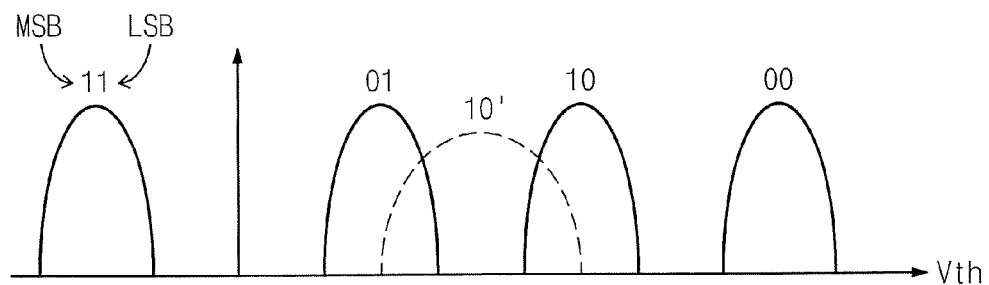
FIG. 1 is a graphic diagram showing threshold voltage distributions of 2-bit multi-level cells and data values corresponding thereto.

Preferred embodiments of the present invention will be described below, exemplarily involving a flash memory device in depicting and illustrating structural and operational features according to some embodiments of the present invention.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 2:
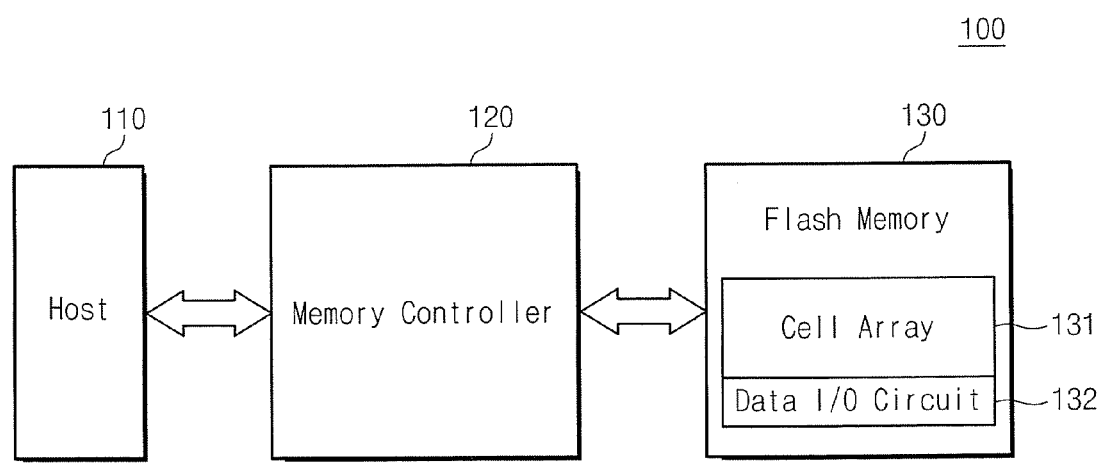
FIG. 2 is a block diagram of a memory system according to some embodiments of the present invention.

FIG. 2 is a block diagram of a memory system according to some embodiments of the present invention. Referring to FIG. 2, the memory system 100 includes a host 110, a memory controller 120, and a flash memory 130.

The flash memory 130 includes a memory cell array 131 and a data input/output circuit 132. The data input/output circuit 132 operates to transfer data into the memory cell array 131 from the memory controller 120 and to transfer data from the memory cell array 131 to the memory controller 120. The memory cell array 131 includes a plurality of nonvolatile memory cells.

The memory controller 120 receives data and writing commands from the host 110, and responsively controls the flash memory 130 to write data in the memory cell array 131. The memory controller 120 also enables the flash memory 130 to read data from the memory cell array 131 in compliance with a read command originated from the host 110.

The flash memory 130 conducts programming operations in units of pages. The memory controller 120 transfers a page of data to the flash memory 130 during a programming operation. The data input/output circuit 132 temporarily stores data that is loaded from the memory controller 120 and programs the loaded data into a selected page. After completing the programming operation, the memory controller 120 executes a program-verifying operation to verify that data has been correctly programmed. If there is a program failure detected, the programming and program-verifying operations are repeated with an increased program voltage. After completing the programming with data of one page (i.e., page data) in this manner, new data is received and a new programming operation starts.

Figure 3:
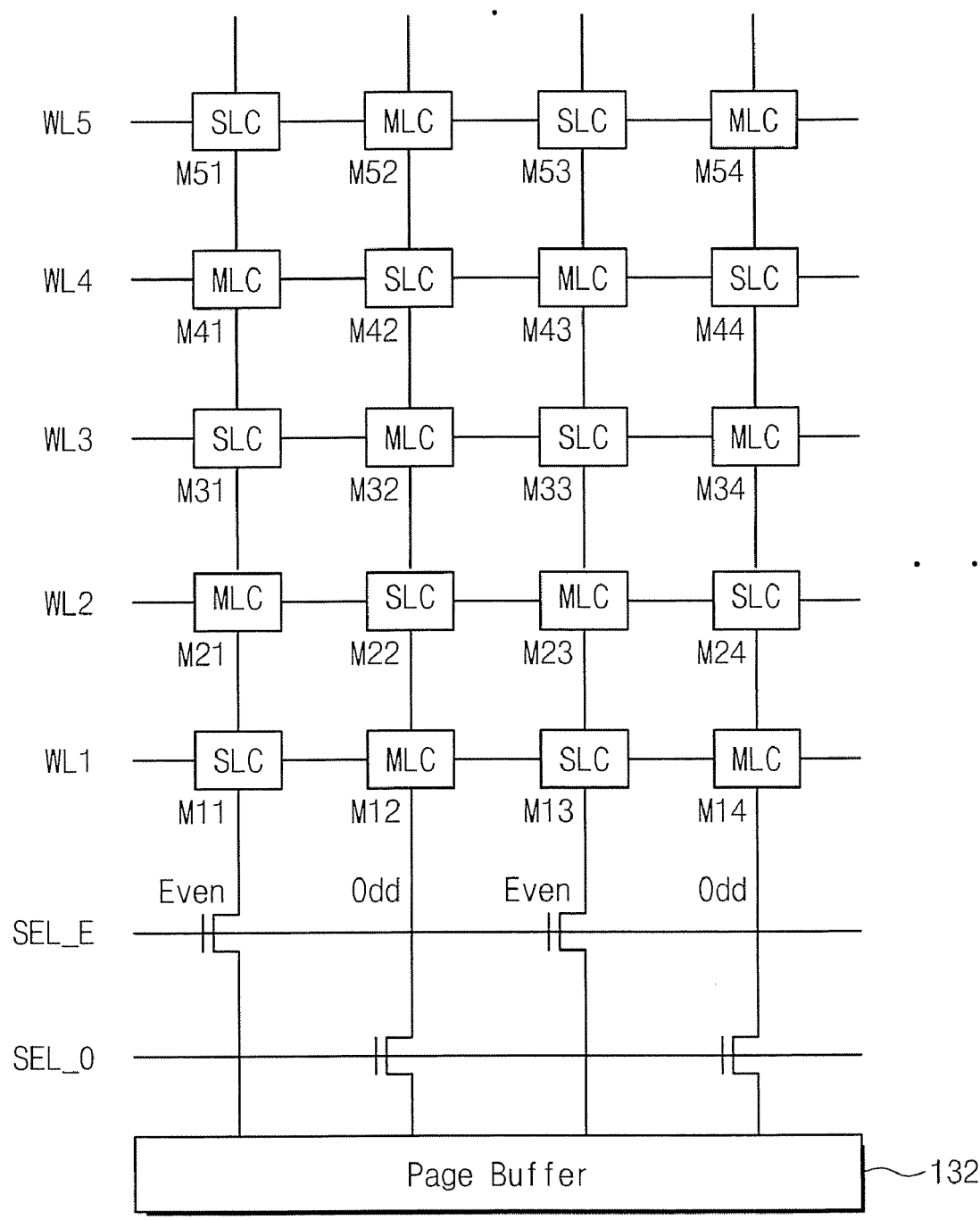
FIG. 3 is a schematic diagram of a memory cell array for the memory system of FIG. 2 according to some embodiments of the present invention.

FIG. 3 is a circuit diagram of a memory cell array 131 for the system shown in FIG. 2 according to some embodiments of the present invention. Word lines WL1, WL2, WL3, WL4, WL5 intersect odd and even bit lines. The odd bit lines are selected by activation of a selection signal SEL_E. The even bit lines are selected by activation of a selection signal SEL_O. Memory cells connected to the odd bit lines store page data in a different form than page data stored in memory cells connected to the even bit lines. For example, odd-numbered memory cells, M11, M13, . . . , store data in a different form than even-numbered memory cells M12, M14, . . .

In the illustrated embodiments, the memory cells storing data bits in different forms are arranged in an alternating pattern. Referring to FIG. 3, the memory cell M11 operates as an SLC storing 1-bit data while the memory cell M12 operates as an MLC storing 2-bit data. The memory cell M21 operates as an SLC storing 1-bit data while the memory cell M22 operates as an MLC storing 2-bit data. While this embodiment shows use of 2-bit MLCs, the present invention is not restricted to such use of 2-bit MLCs. In particular, in some embodiments, higher-order MLCs that store n-bit data (n is an integer) may be used.

In this embodiment, SLCs and MLCs are alternately arranged along rows and columns. As illustrated in FIG. 3, SLCs M11 and M13 are arranged opposites sides adjacent to the MLC M12 in the row direction and the SLC M22 is arranged adjacent the MLC M12 in the column direction. As described later, the MSB of an MLC may be programmed after programming its adjacent SLC(s). The MSB data mean the last page programmed into the MLCs. For instance, the MSB data of 4-bit MLCs correspond to a fourth page programmed therein, and the MSB data of 1-bit SLCs correspond to a first page programmed therein. Thereby, it is possible to suppress interference to the MLCs due to the program voltage applied to the SLCs adjacent to the MLCs.

Figure 4:
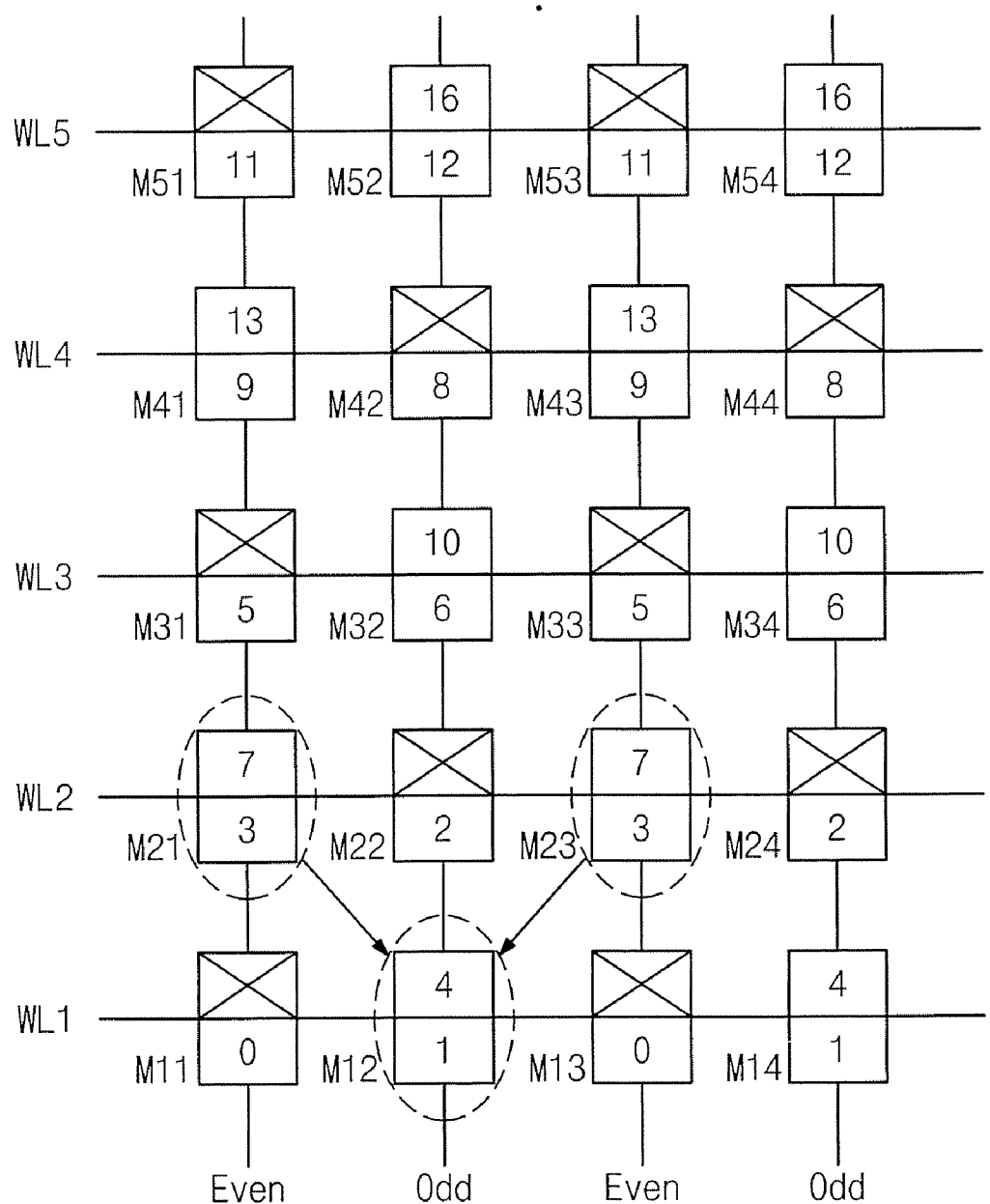
FIG. 4 is a schematic diagram illustrating operations for programming the memory cell array of FIG. 3 according to some embodiments of the present invention.

Programming operations for a flash memory in accordance with some embodiments of the present invention will now be described. Referring to FIG. 4, the numbers marked on the memory cells M11, M12, . . . , M54 indicate page numbers stored therein. For instance, as the memory cells M11, M13, . . . are SLCs, they store only one page (page #0). As the memory cells M12, M14, . . . are 2-bit MLCs, they store two pages (pages #1 and #4). Thus, a word line is able to access three pages in all.

In the illustrated embodiments, programming operations are carried out in the order of the page numbers. First, the page #0 is programmed into the memory cells M11, M13, . . . . Page #1 is programmed into the memory cells M12, M14, . . . in the form of an LSB. The page #2 is programmed into the memory cells M22, M24, . . . Page #3 is programmed into the memory cells M21, M23, . . . in the form of an LSB. Page #4 is programmed into the memory cells M12, M14, . . . in the form of an MSB.

Using such programming operations, interference between the memory cells can be reduced. For example, the memory cell M12 stores the page #1 in the form of LSB and stores the page #4 in the form of MSB.

The memory cell M12 may be affected by interference from programming of the adjacent memory cells M11, M13, M21, M22, and M23. Specifically, the memory cell M12 may be mainly affected by interference from the programming of the memory cells M11 and M13 adjacent thereto along the word-line direction (i.e., the row direction) and from the memory cell M22 adjacent thereto along the bit-line direction (i.e., the column direction). Because the memory cells M21 and M23 adjacent to the memory cell M12 along the diagonal direction are relatively more distant, it may be assumed that interference from programming of these cells is less significant.

According to some embodiments of the present invention, effects on the memory cell M12 may be limited to interference from the memory cells M21 and M23 that are diagonally adjacent thereto. In detail, the memory cell M12 may be affected by interference from the program voltage when the page #7 is stored in the memory cells M21 and M23 adjacent thereto along the diagonal direction. In this case, since the memory cells adjacent to the memory cell M12 along the row and column directions have been already been completely programmed, interference to the memory cell M12 is reduced.

As the memory cells M21 and M23 adjacent to the memory cell M12 along the diagonal direction are more distant than the memory cells M11 and M13, and M22 which are adjacent thereto along the word-line and bit-line directions respectively, the interference by the memory cells M21 and M23 does not cause a trouble to the memory cell M12. Hence, the programming method by the present invention may suppress interference between or among the memory cells. This may improve the reliability of the nonvolatile memory device.

Figure 5:
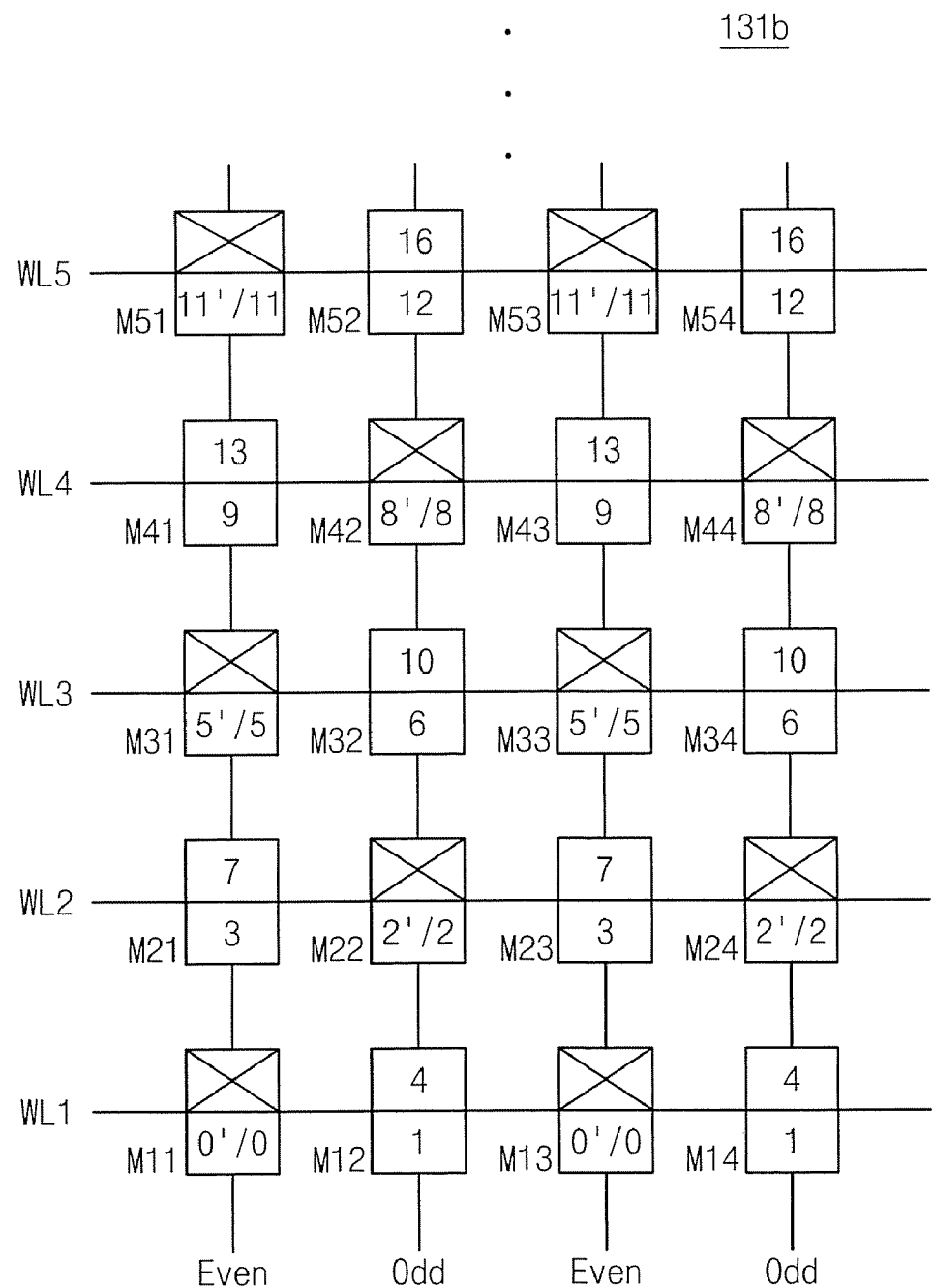
FIG. 5 is a schematic diagram illustrating operations for programming the memory cell array of FIG. 3 according to some embodiments of the present invention.

FIG. 5 shows programming operations according to further embodiments of the present invention. In these embodiments, an SLC is programmed in two operations. For instance, the memory cells M11, M12, . . . are first pre-programmed with the page #0. By the pre-programming operation, threshold voltages of the memory cells M11, M12, . . . are raised, but still remain lower than a target threshold voltage. Then, after programming of page #3, the memory cells M11, M13, . . . are reprogrammed before programming the page #4. Owing to the reprogramming treatment, it is possible to make the memory cell free from interference arising from the programming of the pages #1 and #3. Similarly, the page #2 is reprogrammed before programming the page #7 after programming the page #6. This technique may be effective in suppressing interference to the SLCs from programming of the MLCs.

Figure 6:
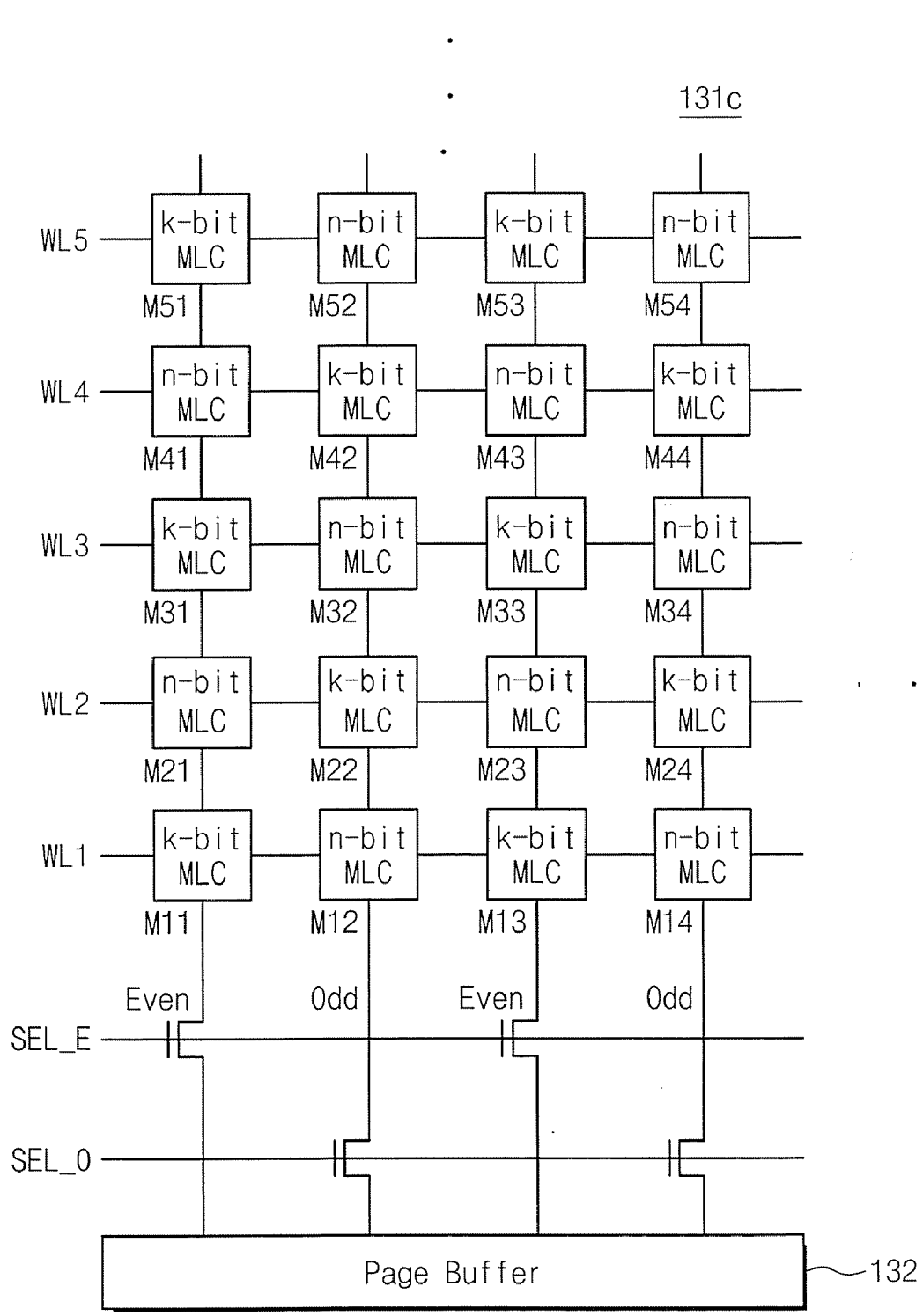
FIG. 6 is a schematic diagram of a memory cell array for the memory system of FIG. 2 according to further embodiments of the present invention.

FIG. 6 is a detailed circuit diagram of a memory cell array for the system shown in FIG. 2 in accordance with further embodiments of the present invention. Referring to FIG. 6, the memory cell array 131b includes k-bit MLCs and n-bit MLCs. In these embodiments, 'n' is larger than 'k'.

In these embodiments, the MSB of the n-bit MLC is programmed after the MSBs of the k-bit MLCs adjacent thereto along the row and column directions. That is, the MSB of the n-bit MLC M12 is programmed later than the MSBs of the k-bit MLCs M11, M13, and M22. For instance, the MSB of the 4-bit MLC M12 is programmed after the MSBs of the 3-bit MLCs M11, M13, and M22. Thereby, interference to the n-bit MLC may be limited to interference from programming of other n-bit MLCs diagonally adjacent thereto. This can improve reliability of the semiconductor memory device.

Figure 7:
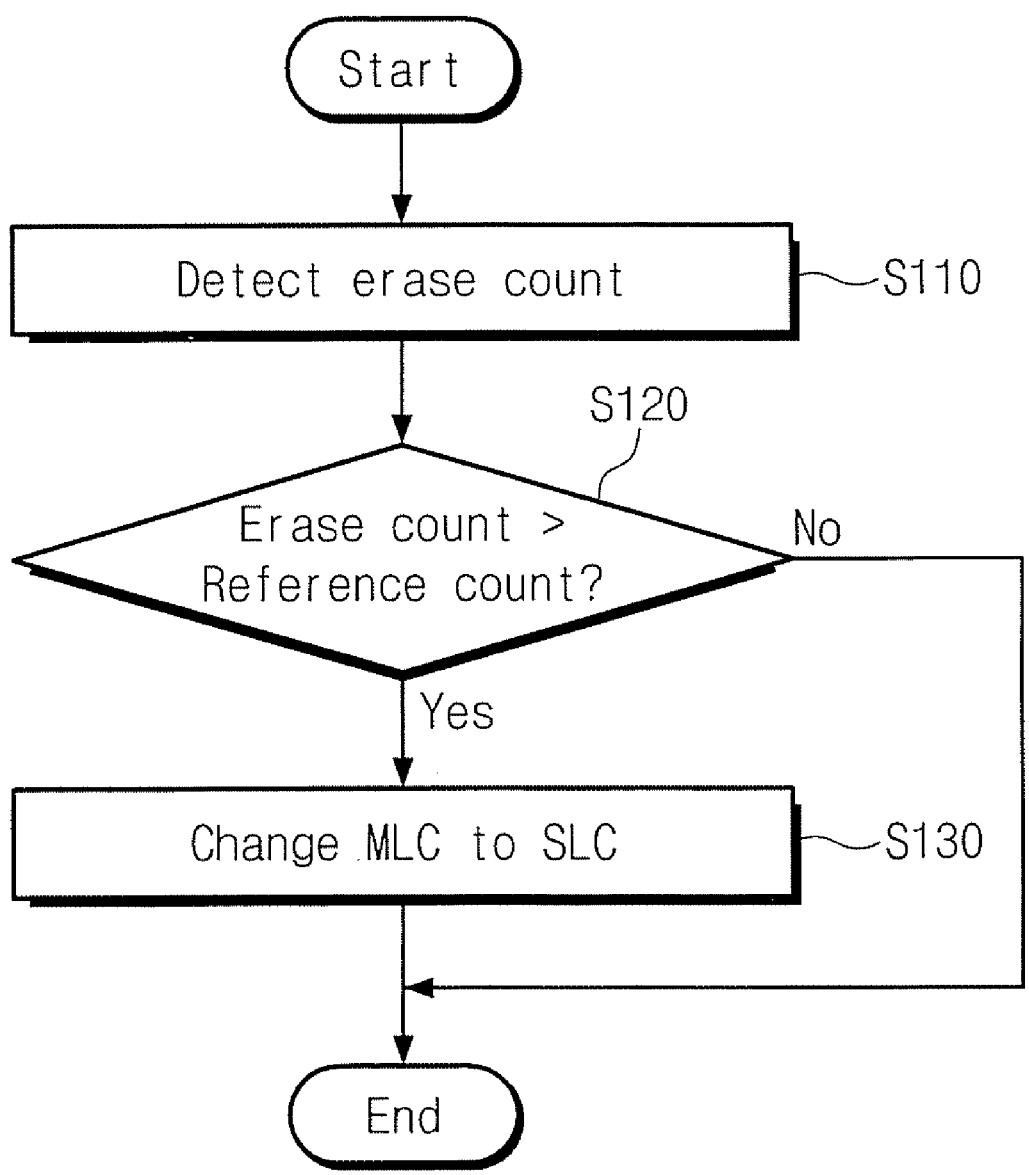
FIG. 7 is a flowchart illustrating operations for converting a multi-level cell into a single level cell in accordance with some embodiments of the present invention.

FIG. 7 is a flow chart showing a procedure for converting a multi-level cell into a single level cell in accordance with some embodiments of the present invention. In these embodiments, a memory block includes SLCs and MLCs. For a flash memory, erasing operations are conducted in units of memory blocks. Therefore, the SLCs and MLCs of a unit memory block are collectively erased in a given erase operation.

Generally, an SLC differs from an MLC in endurance, i.e., the maximum number of erasing times for which normal function of memory cell is assured. For example, if the endurance of a memory cell is ten thousands (10,000) of erase operations, the memory cell cannot be assured of its normal function when it has been erased over 10,000 times. An MLC generally has lower endurance than an SLC. Accordingly, MLCs in a memory block may be disabled even though SLCs are still operable in the memory block. Therefore, it may be desirable to adjust the number of erasing times (hereinafter referred to as 'erasing count') for the MLCs. According to some embodiments of the present invention, when the erasing count of an MLC reaches a reference count, the MLC can be converted into an SLC for continued use.

Referring to FIG. 7, an erasing count is detected in a step S110. This erasing count means the number of erasing operations that have occurred for a memory block. Referring to FIG. 2, the erasing count may be stored in the memory cell array 131 of the flash memory 130 or in the memory controller 120. In a step S120, it is determined whether the erasing count is over a reference count. If the erasing count is over the reference count, a step S130 begins in which the MLCs of the memory block are converted into SLCs.

MLCs may be converted to SLCs according to an erasing count, which can reduce degradation of reliability caused by incapability of the MLCs. However, embodiments of the present invention are not restricted hereto MLC to SLC conversion. In some embodiments, n-bit MLCs can be converted into m-bit MLCs (where m is smaller than n) in accordance with an erasing count. For instance, the 4-bit MLCs can be also converted into 3-bit MLCs in accordance with an erasing count.

Figure 8:
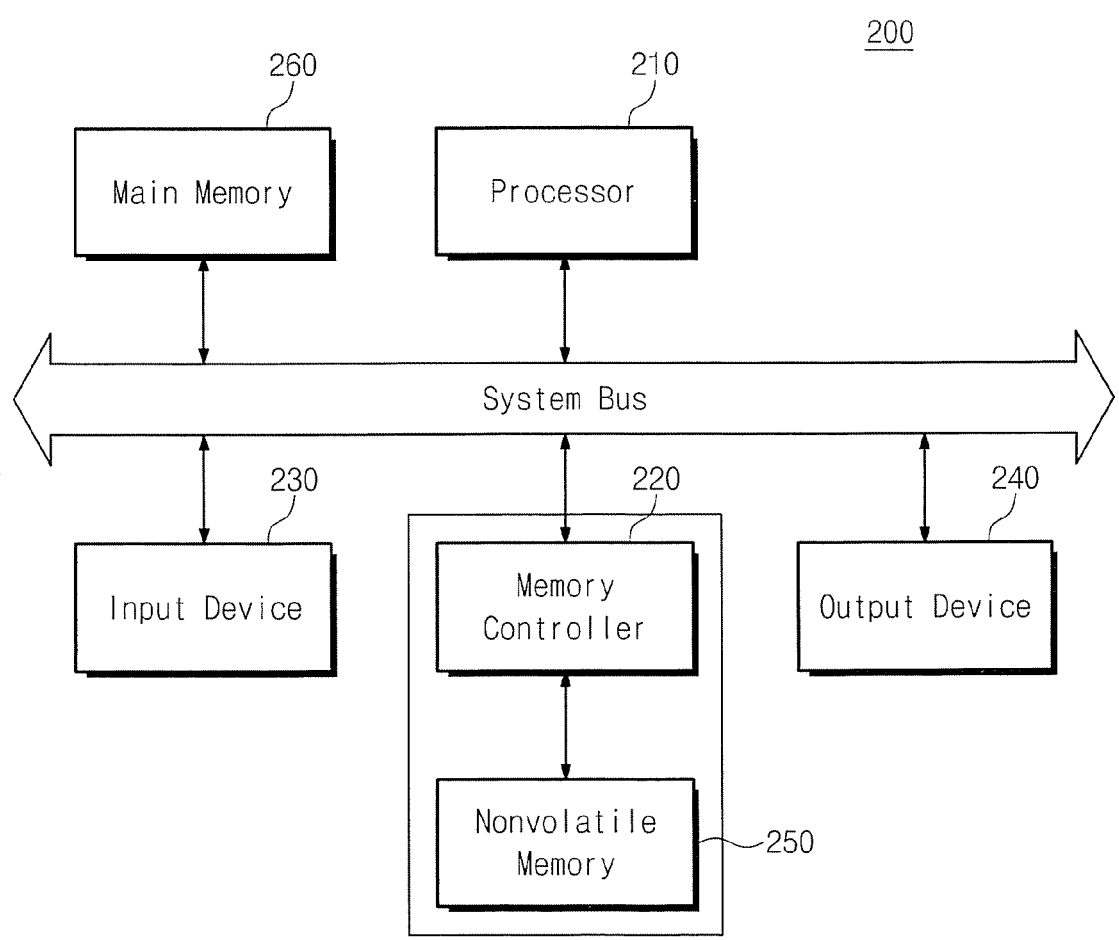
FIG. 8 is a schematic diagram of a computing system including a flash memory device in accordance with some embodiments of the present invention.

FIG. 8 is a schematic block diagram of a computing system 200 including a flash memory device in accordance with some embodiments of the present invention. Referring to FIG. 8, the computing system 200 includes a processor 210, a memory controller 220, input units 230, output units 240, a flash memory 250, and a main memory unit 260. In the figure, the bilateral arrow represents a system bus through which data or commands are transferred.

The memory controller 220 and the flash memory device 250 may be included in a memory card. The processor 210, the input units 230, the output units 240, and the main memory unit 260 may be included in a host using the memory card as a storage unit.

The computing system 200 receives data from an external source through the input units 230 (e.g., keyboards or cameras). The input data may be a command by a user or multimedia data, such as image data taken by a camera. The input data is stored in the flash memory 250 or the main memory unit 260.

A result processed by the processor 210 is stored in the flash memory 250 or the main memory unit 260. The output units 240 output data from the flash memory 250 or the main memory unit 260. For example, the output units 240 output data in visible forms for humans. The output units 940 include display devices or speakers.

Programming operations according to some embodiments of the present invention as described above may be applied to the flash memory 250. Such operations may improve the reliability of the flash memory 250, which may improve the reliability of the computing system 200.

The flash memory 250 and/or the memory controller 220 can be package in any of a number of different ways. For instance, the flash memory 250 and/or the memory controller 220 may be package in a Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

Although not shown in the figure, it can be understood by those skilled in the art that a power supply is required for supplying power to the computing system 200. And, if the computing system 200 is a mobile device, it may be further required of a battery for supplying power thereto.

Figure 9:
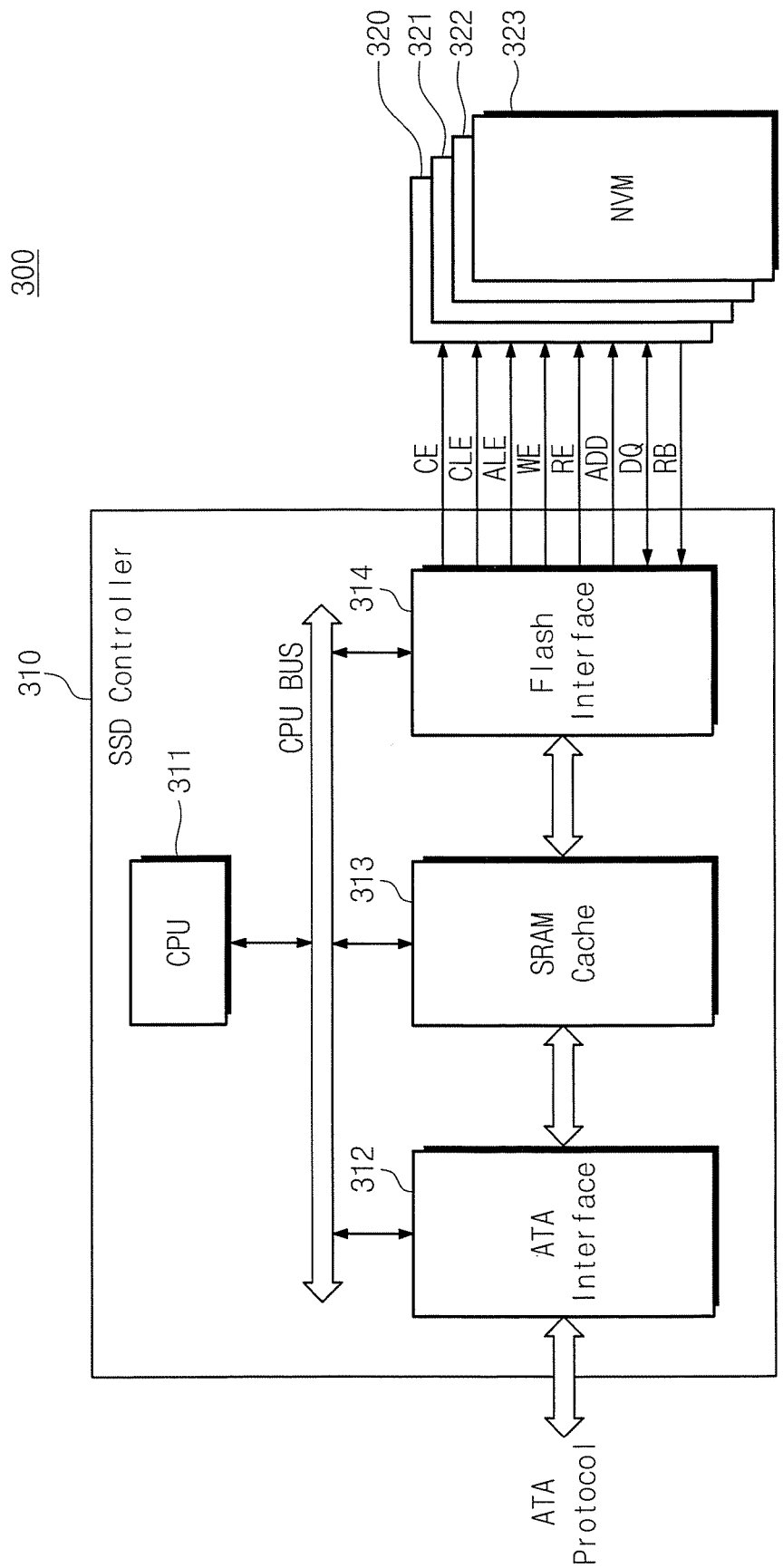
FIG. 9 is a schematic diagram of a solid state disk (SSD) system according to some embodiments of the present invention.

FIG. 9 is a block diagram briefly showing an SSD system 300 according to some embodiments of the present invention. Referring to FIG. 9, the SSD system 300 includes an SSD controller 310 and flash memories 320, 321, 322, 323. The semiconductor memory system according to some embodiments of the present invention is applicable to an SSD (solid state drive). In recent years, SSD products, which are expected to replace hard disk drives (HDDs), are being spotlighted in new generation markets. An SSD is a storage unit using memory chips such as flash memories for storing data, instead of a rotating plate used in a HDD. An SSD may be advantageous in comparison to an HDD, which operates mechanically, in operation rate, external impact, and power consumption.

As shown in FIG. 9, a central processing unit (CPU) 311 accepts a command from a host, and stores data into the flash memory from the host or transfers data to the host from the flash memory. An ATA interface 312 exchanges data with the host in accordance with control of the CPU 311. The ATA interface 312 fetches a command and address from the host and transfers the command and address to the CPU 311 through a CPU bus. Data input from the host or data to be transferred to the host, through the ATA interface 312, is transferred to an SRAM cache 313 in accordance with the central processing unit 311 without passing through the CPU bus.

The SRAM cache 313 temporarily store data moving between the host and the flash memories 320~323. Further, the SRAM cache 313 is used even for storing a program to be used by the CPU 311. The SRAM cache 313 may be regarded as a buffer memory, which is not always organized of an SRAM. A flash interface 314 exchanges data with the non-volatile memories used as storage units. The flash interface 814 may be configured to support a NAND flash memory, a one-NAND flash memory, or a multi-level flash memory.

A semiconductor memory system according to some embodiments of the present invention may be used as a portable storage device. Thus, it can be used as a storage device for an MP3 player, a digital camera, a PDA, or an e-book. Further, it can be used as a storage unit for a digital TV or computer.

Figure 10:
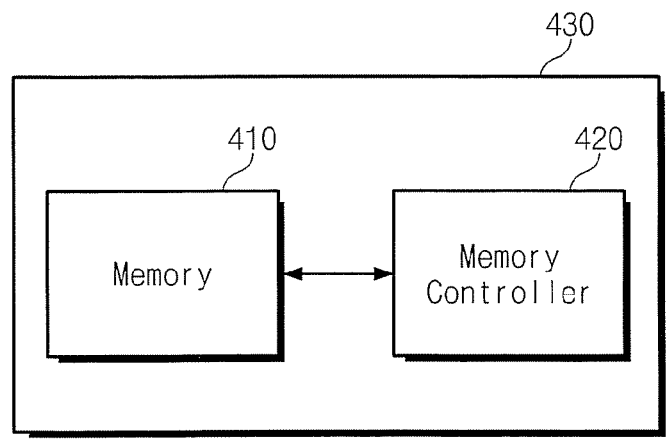
FIG. 10 is a schematic diagram of a memory system according to further embodiments of the present invention.

FIG. 10 is a block diagram showing a memory system according to further embodiments of the present invention. In the memory system shown in FIG. 10, a memory 410 and a memory controller 420 are included in a card 430. The memory card 430 may be, for example, a flash memory card. For example, the card 430 may be a card supporting a certain industrial standard for an electronic apparatus such a digital camera or personal computer. The memory controller 420 may control the memory 410 based on control signals received from another (e.g., external) system by the card 430. The memory 410 and memory controller 420 may operate along the lines discussed above with reference to FIGS. 3-7.

Figure 11:
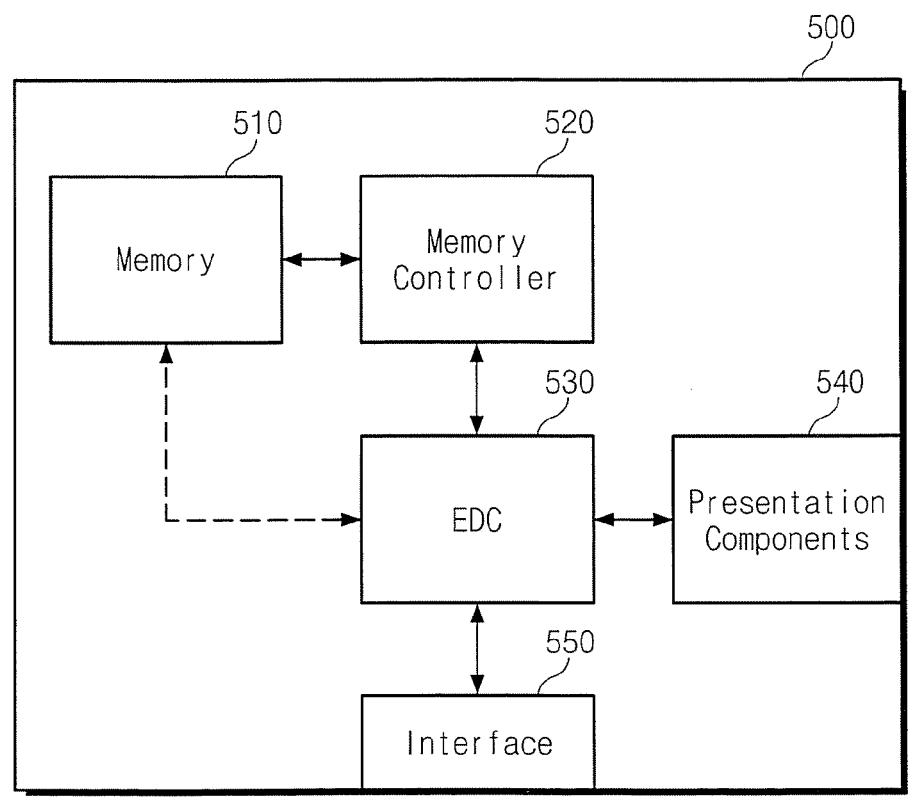
FIG. 11 is a schematic diagram of a memory system according to still further embodiments of the present invention.

FIG. 11 is a block diagram showing a memory system in a portable electronic system 500 according to further embodiments of the present invention. The portable system 500 may be, for example, an MP3 player, a video player, a combination video and audio player, or so forth. As shown in FIG. 11, the portable system 500 includes a memory 510 and a memory controller 520. The portable system 500 may further include an encoder and decoder 530, presentation components 530, and an interface 550.

Data (video, audio, etc.) processed by the encoder and decoder (EDC) 530 can be transferred to and from the memory 510 through the memory controller 520. As illustrated by the dotted line in FIG. 11, data may also be input directly into the memory 510 from the EDC 530 and/or output directly into the EDC 530 from the memory 510. The memory 510 and the memory controller 520 may be configured to operate along the lines discussed above with reference to FIGS. 3-7.

The EDC 530 may be configured to encode data in order to store the data into the memory 510. For instance, the EDC 530 may be configured to perform an MP3 encoding operation to audio data in order to store the data in the memory 510. The EDC 530 may also be configured to conduct an MPEG encoding operation (e.g., MPEG2, MPEG4, etc.) to video data in order to store the data in the memory 510. Further, the EDC 530 may include a plurality of encoders for encoding data of other types in accordance with other data formats. For instance, the EDC 530 may include an MP3 encoder for audio data and an MPEG encoder for video data.

The EDC 530 may be configured to decode an output of the memory 510. For instance, the EDC 530 is able to conduct an MP3 decoding operation to audio data output from the memory 510. In another way, the EDC 530 is able to conduct an MPEG decoding operation (e.g., MPEG2, MPEG4, etc.) to video data output from the memory 510. Further, the EDC 530 may include a plurality of decoders for decoding data of other types in accordance with other data formats. For instance, the EDC 530 may include an MP3 decoder for audio data and an MPEG decoder for video data. It can be also understood that the EDC 530 may include decoders only. For example, previously encoded data can be received by the EDC 530 and passed to the memory controller 520 and/or the memory 510.

The EDC 530 is configured to receive data for encoding, by way of the interface 550, or receive previously encoded data. The interface 550 may conform to a known standard (e.g., firmware, USB, etc.). The interface 550 may further include more one interface units. For instance, the interface 550 may include a firmware interface, a USB interface, and the like. Data from the memory 510 may be output by way of the interface 550.

The presentation components 540 are able to display data output from the memory and/or decoded by the EDC 530. For instance, the presentation components 540 may include a speaker jack configured to output audio data, a display screen configured to output video data and/or other presentation components.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device comprising:
    a memory cell array comprising a first memory cell and second and third memory cells adjacent the first memory cell, wherein the first and second memory cells are connected to the same word line and wherein the first and third memory cells are connected to the same bit line; and
    a data input/output circuit configured to operate the first memory cell as an m-bit cell, to operate the second memory cell as an n-bit cell and to operate the third memory cell as an k-bit cell, wherein k, m and n are integers greater than zero, wherein m is not equal to n and wherein m is not equal to k.

2. The device of claim 1, wherein m is greater than n.

3. The device of claim 2, wherein k is equal to n.

4. The device of claim 1, wherein the data input/output circuit is configured to complete programming of the third memory cell before programming a final bit of the first memory cell in a memory block write operation.

5. The device of claim 1, wherein the data input/output circuit is configured to complete programming of the second and third memory cells before programming a final bit of the first memory cell in a memory block write operation.

6. The device of claim 1, wherein the data input/output circuit is configured to complete programming of the second memory cell before programming a final bit of the first memory cell in a memory block write operation.

7. The device of claim 1, wherein m is equal to 1 and wherein n is equal to 2.

8. The device of claim 7, wherein the data input/output circuit is configured to pre-program the second memory cell before programming a first bit for the first memory cell and to re-program the second memory cell after programming the first bit for the first memory cell.

9. The device of claim 1, wherein the data input/output circuit is configured to operate the first memory cell as a j-bit cell responsive to detecting a number of erase operations for the first memory cell meeting a predetermined criterion, wherein j is an integer greater than zero and less than n.

10. The device of claim 9, wherein j is equal to m.

11. A computing system comprising the nonvolatile memory device of claim 1 coupled to host.

12. A method of operating a nonvolatile memory device comprising a memory cell array comprising a first memory cell and second and third memory cells adjacent the first memory cell, the first and second memory cells connected to the same word line and the first and third memory cells connected to the same bit line, the method comprising:
    operating the first memory cell as an m-bit cell, wherein m is an integer greater than zero;
    operating the second memory cell as an n-bit cell, wherein n is an integer greater than zero and wherein m is not equal to n; and
    operating the third memory cell as a k-bit cell, wherein k is an integer greater than zero wherein m is not equal to k.

13. The method of claim 12, further comprising completing programming of the second memory cell before programming a final bit of the first memory cell in a memory block write operation.

14. The method of claim 12, wherein m is equal to 1 and wherein n is equal to 2.

15. The method of claim 14, further comprising:
    pre-programming the second memory cell;
    programming a first bit for the first memory cell after pre-programming the second memory cell; and
    re-programming the second memory cell after programming the first bit for the first memory cell.

16. A method of operating a nonvolatile memory device comprising a memory cell array comprising a first memory cell and an adjacent second memory cell, the method comprising:
    operating the first memory cell as an m-bit cell and operating the second memory cell as an n-bit cell, wherein m and n are integers greater than zero and wherein m is not equal to n; and
    operating the first memory cell as a j-bit cell responsive to detecting a number of erase operations for the first memory cell meeting a predetermined criterion, wherein j is an integer greater than zero and less than n.

17. The method of claim 16, wherein j is equal to m.

* * * * *